US010856019B2

(12) United States Patent
Martel

(10) Patent No.: US 10,856,019 B2
(45) Date of Patent: *Dec. 1, 2020

(54) SYSTEMS AND METHODS FOR SHARING ENCODER OUTPUT

(71) Applicant: Verint Americas Inc., Alpharetta, GA (US)

(72) Inventor: Hugo Martel, Quebec (CA)

(73) Assignee: Verint Americas Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/024,230

(22) Filed: Jun. 29, 2018

(65) Prior Publication Data

US 2018/0310041 A1 Oct. 25, 2018

Related U.S. Application Data

(63) Continuation of application No. 14/922,249, filed on Oct. 26, 2015, now Pat. No. 10,038,923, which is a (Continued)

(51) Int. Cl.
*H04N 21/2343* (2011.01)
*H04N 7/52* (2011.01)
(Continued)

(52) U.S. Cl.
CPC ......... *H04N 21/23439* (2013.01); *H04N 7/24* (2013.01); *H04N 7/52* (2013.01); *H04N 21/2187* (2013.01); *H04N 21/234309* (2013.01); *H04N 21/234381* (2013.01); *H04N 21/4223* (2013.01); *H04N 21/44029* (2013.01); (Continued)

(58) Field of Classification Search
CPC ....... H04N 21/23439; H04N 21/85406; H04N 21/234309; H04N 21/44029; H04N 21/440281; H04N 21/4223; H04N 21/234381; H04N 21/2187; H04N 21/6373; H04N 21/4436; H04N 7/24; H04N 7/52; H03M 7/4068; H03M 7/6047; H03M 7/3006
See application file for complete search history.

(56) References Cited

U.S. PATENT DOCUMENTS

2006/0212818 A1 9/2006 Lee
2006/0271695 A1* 11/2006 Lavian .................. G06F 21/552
709/229
(Continued)

*Primary Examiner* — Tracy Y. Li
(74) *Attorney, Agent, or Firm* — Christopher M. Scherer; DeWitt LLP

(57) ABSTRACT

Embodiments described herein provide systems and methods for sharing encoder output of video streams. In a particular embodiment, a method provides determining video profiles for each of a plurality of devices. The method further provides determining if two or more of the video profiles are similar by determining if parameters associated with each video profile differ by less than a threshold value. The method further provides transmitting a video stream encoded in a single format to the devices if they have similar profiles and transmitting video streams encoded in different formats to the devices if they do not have similar profiles.

25 Claims, 10 Drawing Sheets

Related U.S. Application Data continuation of application No. 13/439,820, filed on Apr. 4, 2012, now Pat. No. 9,172,924.

(60) Provisional application No. 61/472,068, filed on Apr. 5, 2011, provisional application No. 61/471,312, filed on Apr. 4, 2011.

(51) Int. Cl.
| | | |
|---|---|---|
| *H04N 7/24* | (2011.01) | |
| *H04N 21/2187* | (2011.01) | |
| *H04N 21/4402* | (2011.01) | |
| *H04N 21/4223* | (2011.01) | |
| *H04N 21/443* | (2011.01) | |
| *H04N 21/6373* | (2011.01) | |
| *H04N 21/854* | (2011.01) | |
| *H03M 7/30* | (2006.01) | |
| *H03M 7/40* | (2006.01) | |
| *H03M 7/32* | (2006.01) | |

(52) U.S. Cl.
CPC .. *H04N 21/4436* (2013.01); *H04N 21/440281* (2013.01); *H04N 21/6373* (2013.01); *H04N 21/85406* (2013.01); *H03M 7/3006* (2013.01); *H03M 7/4068* (2013.01); *H03M 7/6047* (2013.01)

(56) References Cited

U.S. PATENT DOCUMENTS

| | | |
|---|---|---|
| 2007/0204311 A1* | 8/2007 | Hasek ............... H04N 7/17318 725/91 |
| 2008/0056145 A1 | 3/2008 | Woodworth |
| 2009/0041430 A1* | 2/2009 | Ishizaka ............... G11B 27/329 386/326 |
| 2009/0106082 A1* | 4/2009 | Senti ..................... G06Q 30/02 705/7.33 |
| 2010/0022265 A1 | 1/2010 | Dei et al. |
| 2011/0219229 A1 | 9/2011 | Cholas et al. |
| 2012/0141041 A1 | 6/2012 | Song et al. |

* cited by examiner

SYSTEMS AND METHODS FOR SHARING ENCODER OUTPUT

RELATED APPLICATIONS

This application is a continuation of U.S. patent application Ser. No. 14/922,249, filed Oct. 26, 2015 which application is a continuation of U.S. patent application Ser. No. 13/439,820, filed Apr. 4, 2012 and claims the benefit of U.S. Provisional Application No. 61/472,068, filed Apr. 5, 2011, and U.S. Provisional Application No. 61/471,312, filed Apr. 4, 2011, the contents of which are incorporated herein by reference in their entireties.

TECHNICAL BACKGROUND

Video systems contain many different types of devices which may receive, process, store, or transmit video in different formats. These devices may be cameras, recorders, viewing devices, storage devices, transmission devices, coder-decoders (codecs), encoders, or other devices. These different devices may use different video formats due to hardware limitations, software limitations, bandwidth requirements, storage limitations, interface requirements, or for other reasons. Many different video formats are possible. As a result, video may be transmitted or stored in multiple different formats within a single video system. Each video format that is generated requires the resources of a codec or encoder to generate an instance of the video in each format.

OVERVIEW

Embodiments described herein provide systems and methods for sharing encoder output of video streams. In a particular embodiment, a method provides determining video profiles for each of a plurality of devices. The method further provides determining if two or more of the video profiles are similar by determining if parameters associated with each video profile differ by less than a threshold value. The method further provides transmitting a video stream encoded in a single format to the devices if they have similar profiles and transmitting video streams encoded in different formats to the devices if they do not have similar profiles.

DETAILED DESCRIPTION

Figure 1:
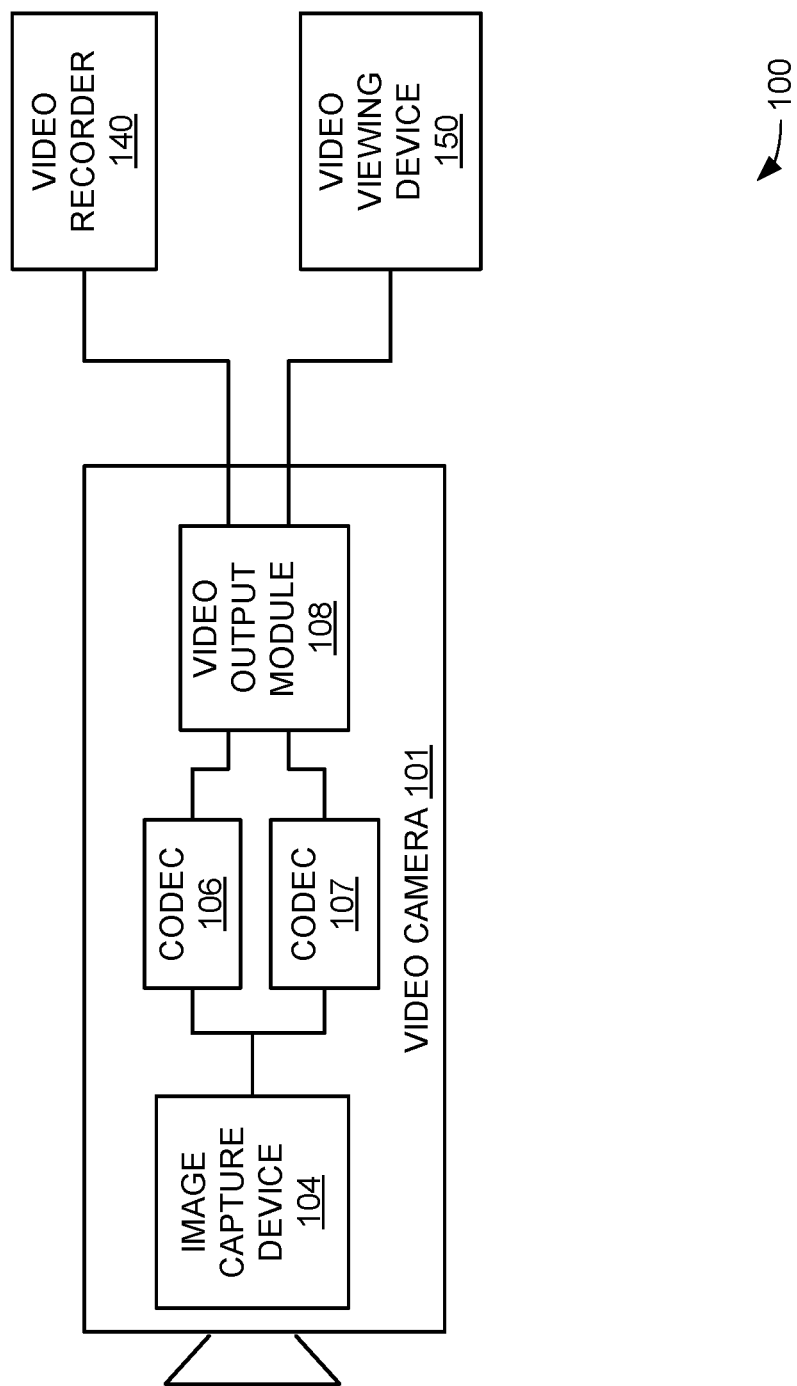
FIG. 1 illustrates a video system.

FIGS. 1-10 and the following description depict specific embodiments of the invention to teach those skilled in the art how to make and use the best mode of the invention. For the purpose of teaching inventive principles, some conventional aspects have been simplified or omitted. Those skilled in the art will appreciate variations from these embodiments that fall within the scope of the invention. Those skilled in the art will appreciate that the features described below can be combined in various ways to form multiple embodiments and variations of the invention. As a result, the invention is not limited to the specific embodiments described below, but only by the claims and their equivalents.

Video systems are often configured to generate video streams in multiple different formats. Different video formats may be needed by or desired for various devices or users in the system. Different formats may be used due to hardware limitations, software limitations, bandwidth constraints, storage limitations, interface requirements, or for other reasons. For example, it may be desirable for users of a system to view live video streams in the highest possible available resolution and frame rate while the video stream provided to a video recorder for archiving purposes may have to be at a lower resolution or frame rate due to storage space limitations.

In another example, one video receiving device may be within the same network as the video source or connected by a high speed connection, while a second video receiving device has a more limited connection to the video system. The connection limitations may require that video be sent to the second receiving device at a lower resolution or frame rate. This means the video has to be encoded in a separate format for this second device. Using a second encoder may place additional software, hardware, power, or processing requirements on the system.

The following is a non-exhaustive list of video formats which may be used in the video systems described herein: MPEG-1, MPEG-2, MPEG-4, MPEG-7, MPEG-21, H.264, DV, MiniDV, DVCAM, DVCPRO, DVCPRO50, DVCPRO HD, HDV, DVD, Blu-Ray, HD-DVD, HD-VMD, CH-DVD, HDTV, 1080i, 1080p, Flash, Quicktime, RealMedia, VHS, VHS-C, S-VHS, S-VHS-C, D-VHS, Windows Media, 8 mm, Video8, Hi8, Digital8, Beta, Betamax, Betacam, Betacam SP, Betacam SX, Digital Betacam, 3GP, and 3G2.

A video profile of a device indicates which video format or formats a device is capable of receiving and processing. The video profile also may specify further video parameters within each video format. These further parameters may include bit rate, frame rate, image resolution, or other parameters. These parameters vary between different video formats and may even vary within a single video format. In other words, two video streams may both be transmitting the same video in MPEG-4 format but may each have a different bit rate, frame rate, or resolution. A video profile specifies the formats of video which are acceptable to a device as well as these other parameters for each of the formats, including ranges of parameters if applicable.

FIG. 1 illustrates video system 100. Video system 100 comprises video camera 101, video recorder 140, and video viewing device 150. Video camera 101 comprises image capture device 104, codecs 106-107, and video output module 108. Each of video recorder 140 and video viewing device 150 have a video profile specifying acceptable formats and parameters for that device. Codecs 106-107 generate video in different formats and provide the formatted video to video output module 108. It should be understood that video recorder 140 and video viewing device 150 may be replaced or supplemented by many other types of devices which receive, process, relay, display, or store video.

Figure 2:
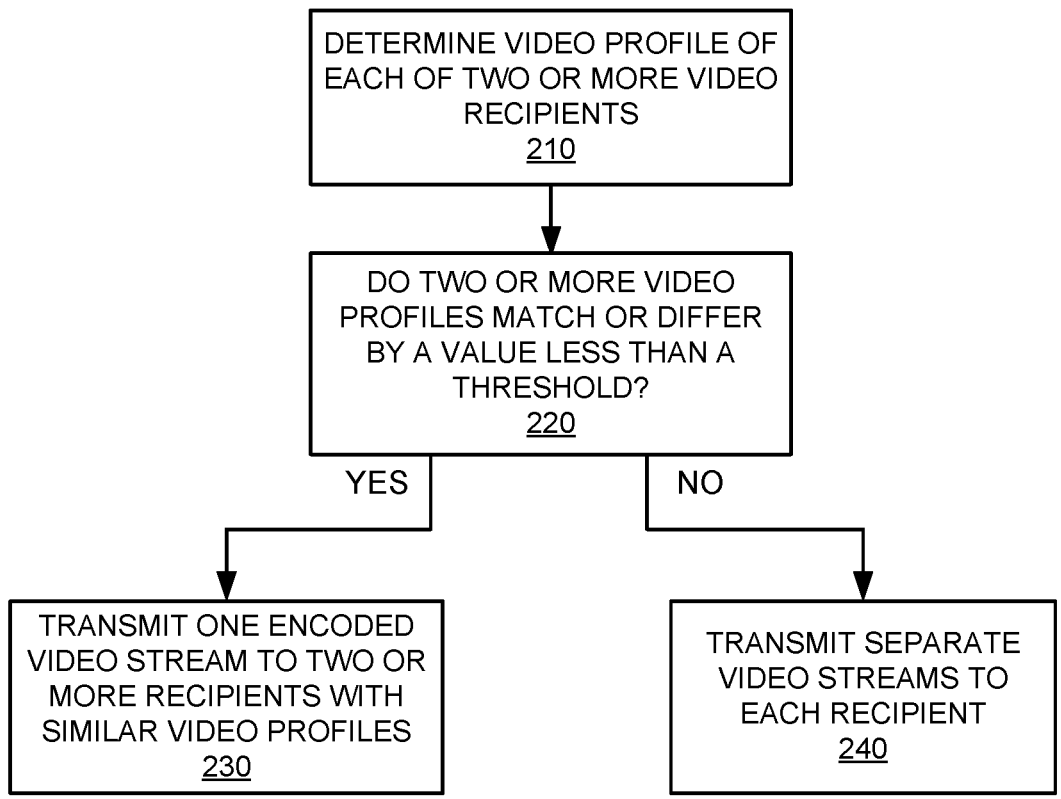
FIG. 2 illustrates an operation of a video system.

FIG. 2 illustrates an operation of video system 100. The steps of operation are indicated below parenthetically. Video output module 108 determines the video profiles associated with video recorder 140 and video viewing device 150 (210). Video output module 108 may make this determination based on information received from video recorder 140 and video viewing device 150, based on information already contained within video output module 108, or based on information obtained from other sources.

Video output module 108 then determines if the video profile of video recorder 140 and video viewing device 150 match or differ by a value less than a threshold (220). For example, the profiles of both video recorder 140 and video viewing device 150 may indicate they are configured to receive MPEG-4 video and do so at the same frame rates, bit rates, and resolution. These would be matching video profiles.

In another example, both video recorder 140 and video viewing device 150 may be configured to receive MPEG-4 video but may have different specified frame rates, bit rates, resolutions, or other parameters. For example, the profile of video viewing device 150 may indicate a frame rate which is higher than that of video recorder 140. If one or more parameters differ by a value less than a specified threshold amount, the two profiles may be treated as similar. For example, if a threshold value is set at 20% and the differences in the frame rates in the profiles of video recorder 140 and video viewing device 150 differ by less than 20%, they may be treated as being similar enough to receive the same video stream. Many other types of threshold comparisons are possible including combinations of multiple thresholds for multiple parameters.

Continuing with FIG. 2, if the profiles match or are similar, as determined by the threshold method described above, video output module 108 transmits the same encoded video stream to both video recorder 140 and video viewing device 150 (230). This may be true even though the parameters of the video stream do not necessarily identically match all of the parameters of one or more of the receiving device. In this case, only one of codecs 106-107 may need to be operated because the output of one of them will be sufficient to supply video streams to both receiving devices. In this way power, processing resources, or other resources can be saved by using only one of codecs 106-107 to meet the needs of both devices.

If the video profiles do not match or are not sufficiently similar, separately encoded video streams will be transmitted to each of video recorder 140 and video viewing device 150 by video output module 108 (240). Codec 106 and codec 107 will be simultaneously operated to produce the two differing video streams.

Referring back to FIG. 1, video camera 101 comprises image capture device 104, codecs 106-107, and video output module 108. Video camera 101 may also comprise other components or circuitry for capturing and transmitting images. For example, video camera 101 may be an analog camera, digital camera, internet protocol (IP) camera, or other type of camera. Image capture device 104 performs the initial optical capture of images and translates them into electronic signals, digital values, or some combination thereof. Image capture device 104 may be a sensor, charge-coupled device (CCD) or other similar device.

It should be understood that the remainder of the functions described herein with respect to video camera 101 may be performed by other devices which transmit video even though they do not perform the initial optical capture of the video. For example, video camera 101 could also be replaced in FIG. 1 by a video switch, video buffer, video server, or other video transmission device, including combinations thereof.

Codecs 106-107 comprise software or circuitry for coding or decoding video signals. Codecs 106-107 may be implemented entirely in software and executed on a processor of video camera 101, may be implemented in hardware, or may be implemented using some combination of hardware and software. Codecs 106-107 may not actually be two separate devices but may be one set of software or hardware which is capable of simultaneously encoding or decoding video streams in two or more different formats. Each codec may be configured to produce video in only one format or may be capable of producing video in many different formats. Codecs 106-107 may also perform analog-to-digital conversion, transformations, mathematical computations, modifications, formatting, conditioning, other processes, or combinations thereof.

Video output module 108 comprises an interface for transmitting video. Video output module 108 module may also comprise additional interfaces for receiving and transmitting video in various formats. Video output module 108 also contains circuitry or software for determining similarities in video profiles and transmitting video to video recorder 140, video viewing device 150, or other recipient devices based of their video profiles. Video output may also contain circuitry or software for switching, multiplexing, buffering, conditioning, or otherwise modifying video signals or packets of video data. Video output module 108 is illustrated in FIG. 1 as being part of video camera 101 but could be implemented outside of video camera 101.

Video recorder 140 receives video from video output module 108 and records the video. Video recorder 140 comprises an interface for receiving video and components for storing the video. The storage components of video recorder 140 may comprise a disk drive, optical disk, flash memory, solid state memory, tape drive, or other device for storage of digital data, including combinations thereof. Video recorder 140 may also comprise additional interfaces for transmitting or receiving video or images, a user interface, software, a power supply, or structural support. Video recorder 140 may be a computer, server, disk array, or other device which stores video, including combinations thereof. Video recorder 140 may also perform other processing, conditioning, formatting, or analysis on the recorded video.

Video viewing device 150 comprises any device for displaying video to a user. Video viewing device 150 displays video received from video output module 108. Video viewing device 150 may comprise a liquid crystal display (LCD), cathode ray tube (CRT), or other type of display device. Video viewing device 150 may be a component of a computer system, communication device, or other type of system.

Figure 3:
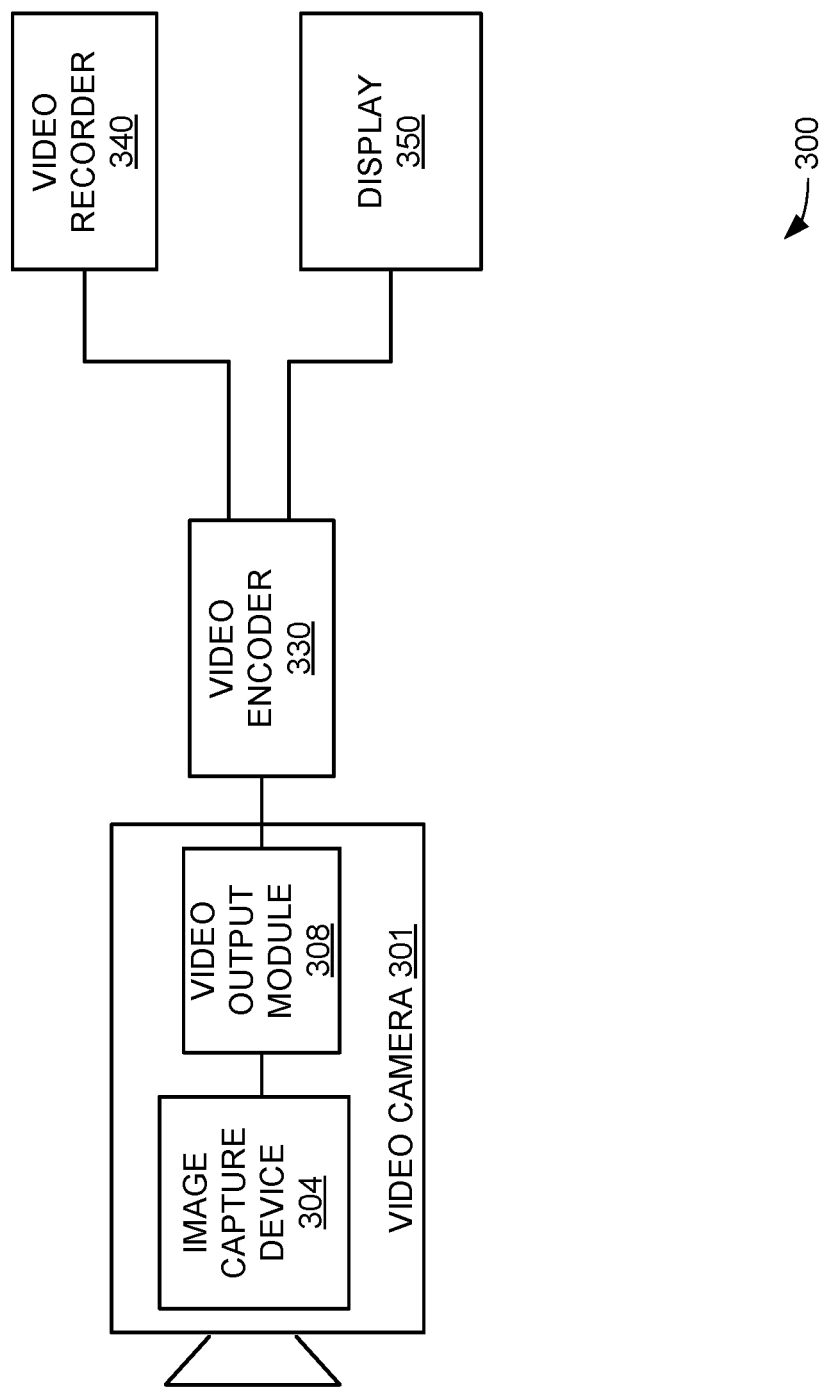
FIG. 3 illustrates a video system which uses a video encoder.

FIG. 3 illustrates video system 300 which uses a video encoder. Video system 300 comprises video camera 301, video encoder 330, video recorder 340, and display 350.

Video camera 301 comprises image capture device 304 and video output module 308. Video camera 301 is an example of video camera 101 although video camera 301 may have an alternate configuration or operate in an alternate manner. Codecs 106-107 of video camera 101 are not illustrated as components of video camera 301 but video camera 301 may contain similar functions.

Video recorder 340 is an example of video recorder 140 although video recorder 340 may have an alternate configuration or operate in an alternate manner. Display 350 is an example of video viewing device 150 although display 350 may have an alternate configuration or operate in an alternate manner.

Video encoder 330 processes, converts, or formats video, video streams, or images. Video encoder 330 comprises processing circuitry and an interface for receiving and transmitting video. Video encoder 330 is capable of performing one or more processes on video received from one or more video sources including video camera 301. The processes performed on the video may include analog-to-digital conversion, transformations, mathematical computations, modifications, formatting, conditioning, other processes, or combinations thereof. Video encoder 330 performs processes similar to those described with respect to codecs 106-107. Video encoder 330 contains software or hardware modules which encode video signals. Video encoder 330 may use separate interfaces for receiving and transmitting video. Video encoder 330 may also comprise a user interface, memory, software, communication components, a power supply, or structural support.

Video system 300 performs functions similar to those described with respect to video system 100 although the operation of video system 300 may vary. In one example of operation, video encoder determines the video profiles associated with video recorder 340 and display 350. Video encoder 330 may make this determination based on information received from video recorder 340 and display 350, based on information already available to video encoder 330, or based on information obtained from other sources.

Video encoder 330 determines if the video profile of video recorder 340 and display 350 match or differ by a value less than a threshold. For example, the profiles of both video recorder 340 and display 350 may indicate they are configured to receive H.264 video and do so at the same frame rates, bit rates, and resolution. These would be matching video profiles.

In another example, both video recorder 340 and display 350 may be configured to receive H.264 video but may have other profile parameters which differ. For example the video profile of display 350 may indicate a resolution which is higher than that of video recorder 340. Even though the resolution parameters are different, if they differ by less than a threshold value they may still be treated as matching. For example, if a threshold value is set at 10% and the differences in the resolutions specified in the profiles of video recorder 340 and display 350 differ by less than 10%, they may be treated as being similar enough to receive the same video stream. The threshold may also be specified in terms of an absolute difference rather than a percentage difference. Many other types of threshold comparisons are possible including combinations of multiple thresholds for multiple parameters.

If the video profiles match or are similar, as determined by the threshold method described above, video encoder 330 transmits the same encoded video stream to both video recorder 340 and display 350. This may be true even though the parameters of the video stream do not identically match all of the parameters of one or more of the receiving devices. In this way, video encoder 330 is able to execute a single video encoding process to meet the needs of both devices. If this is not the case, video encoder would need to operate two or more video encoding processes to produce video streams which match the video profiles. This may require additional power, processing resources, configuration, software, or even an additional video encoder.

If the video profiles do not match or are not sufficiently similar based on the comparison processes described above, separately encoded video streams will be transmitted to each of video recorder 340 and display 350.

Video encoder 300 may operate in a manner similar to that described above and provide the same video stream to video recorder 340 and display 350 even though their profiles indicate different video formats if those different video formats have sufficient common characteristics.

Figure 5:
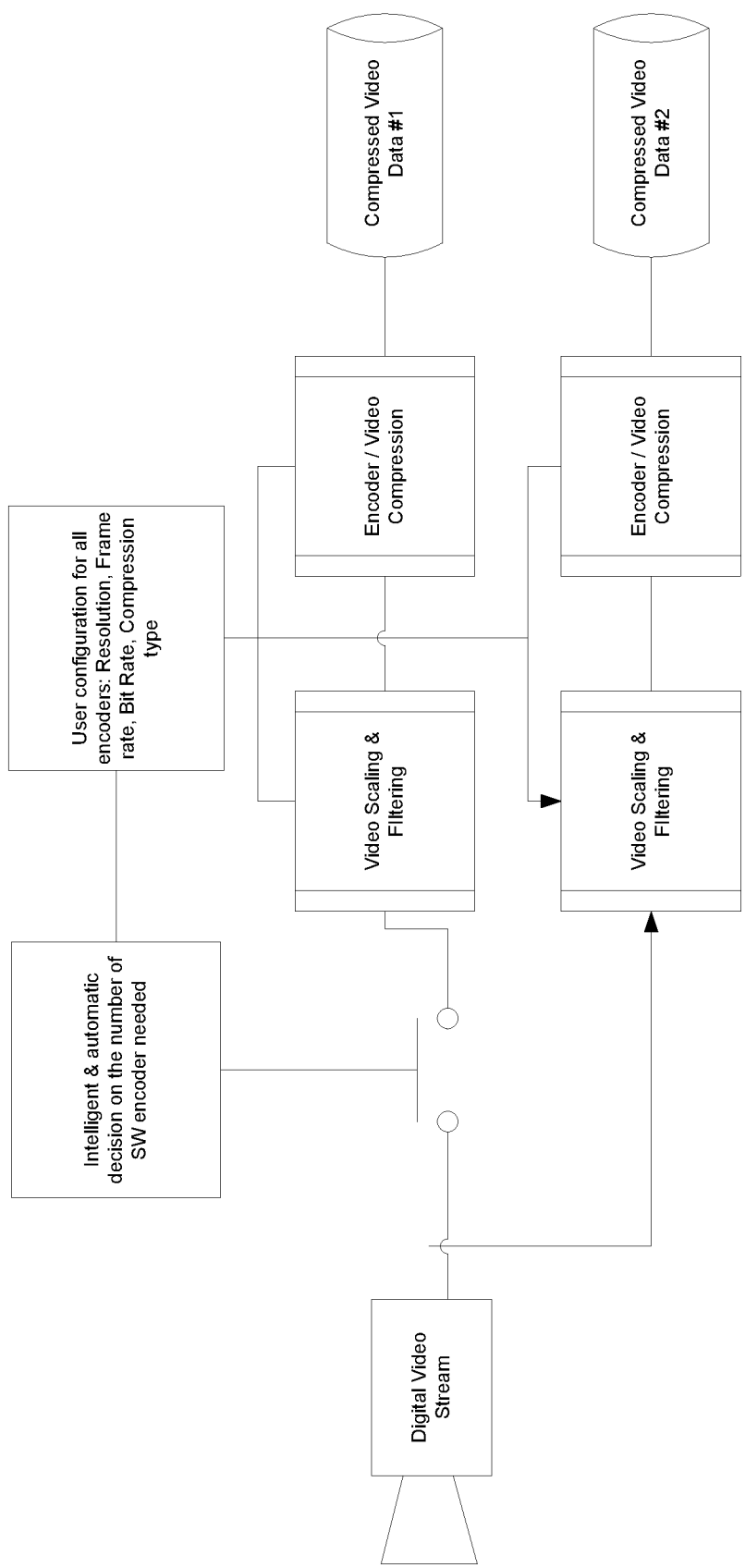
FIG. 5 illustrates as video system with two video encoders.

FIG. 5 illustrates a video system similar to video system 300 which uses two separate video encoders. The functions performed by video encoder 330 of FIG. 3 are split between the video scaling and filtering devices and encoder/video compression devices of FIG. 5.

Figure 4:
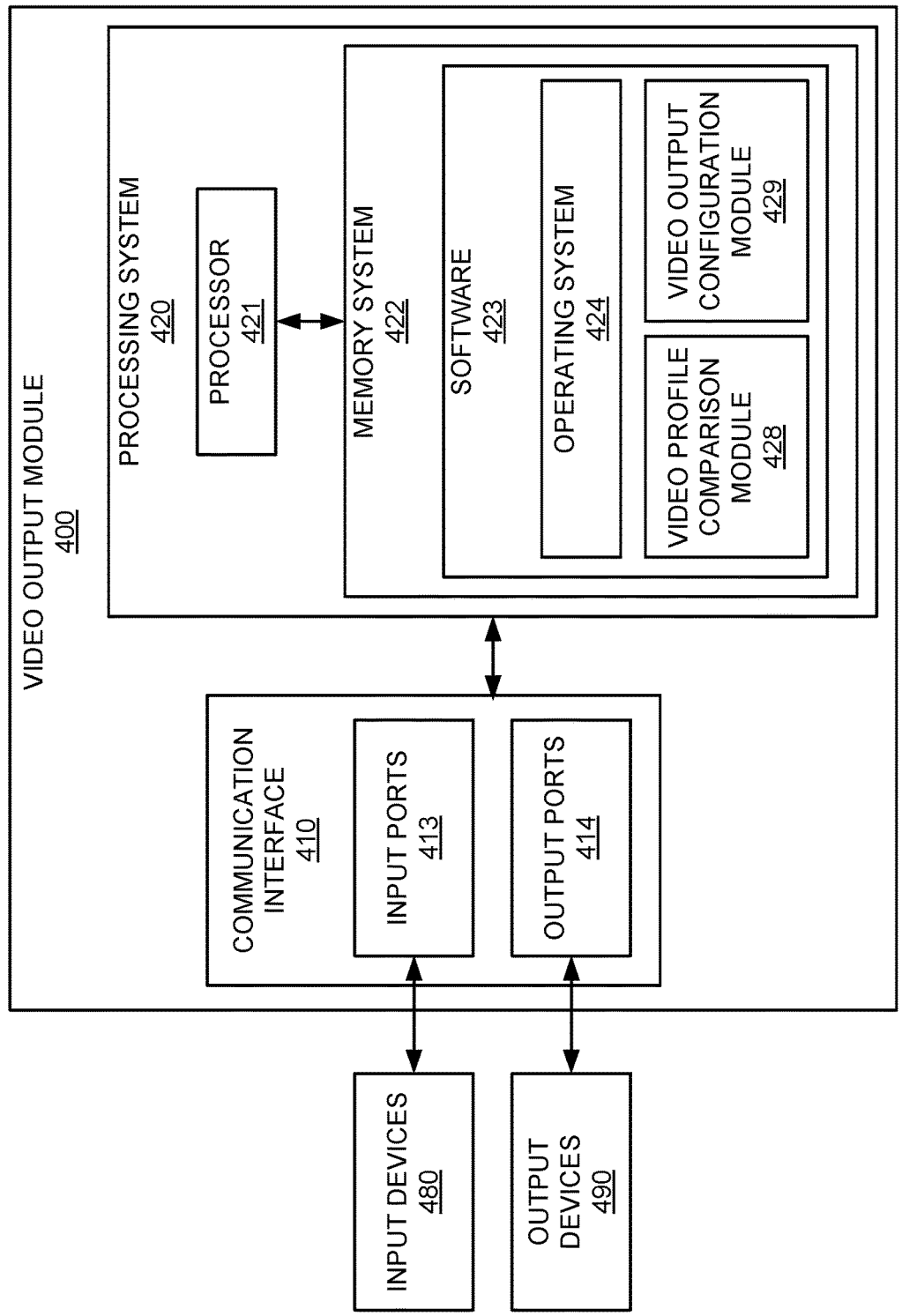
FIG. 4 illustrates a video output module.

FIG. 4 illustrates video output module 400. Video output module 400 is an example of video output module 108 although video output module 400 may have an alternate configuration or operate in an alternate manner. Video output module 400 includes communication interface 410 and processing system 420. Processing system 420 is linked to communication interface 410 through a communication link. Processing system 420 includes processor 421 and memory system 422.

Communication interface 410 includes input ports 413, and output ports 414. Communication interface 410 includes components that communicate over communication links, such as network cards, ports, RF transceivers, processing circuitry and software, or some other communication device. Communication interface 410 may be configured to communicate over metallic, wireless, or optical links. Communication interface 410 may be configured to use TDM, IP, Ethernet, optical networking, wireless protocols, communication signaling, or some other communication format, including combinations thereof. Codecs 106-107 are examples of input devices 480. Video recorder 140 and video viewing device 150 are examples of output devices 490.

Processor 421 includes microprocessor and other circuitry that retrieves and executes operating software from memory system 422. Memory system 422 comprises software 423. Memory system 422 may be implemented using random access memory, read only memory, a hard drive, a tape drive, flash memory, optical storage, or other memory apparatus.

Software 423 comprises operating system 424, video profile comparison module 428, and video output configuration module 429. Software 423 may also comprise additional computer programs, firmware, or some other form of non-transitory, machine-readable instructions. Video output module 400 is capable of receiving encoded video streams from codecs 106-107 through input ports 413. When executed by processor 421, software 423 directs processing system 420 to operate video processing system 400 to determine if two or more video profiles match or differ by a value less than a threshold using video profile comparison module 428. Software 423 also directs processing system 420 to configure output ports 414 to transmit the same encoded video stream to devices associated with the matching or similar profiles using video output configuration module 429 and output ports 414.

The systems and methods described above with respect to FIGS. 1-5 may be used in conjunction with, or integrated within, the systems and methods described below with respect to FIGS. 6-10 for varying encoder rate of the video streams based on power or temperature. Alternatively, the systems and methods described below may be used independently.

Video encoders and codecs are used in video systems to convert video from one format to another. The conversion may be from analog to digital, from a raw digital format to MPEG, or between many other possible formats. The encoders or codecs may be located at many different places within the system. The following is a non-exhaustive list of video formats which may be used in the video systems described herein: MPEG-1, MPEG-2, MPEG-4, MPEG-7, MPEG-21, H.264, DV, MiniDV, DVCAM, DVCPRO, DVCPRO50, DVCPRO HD, HDV, DVD, Blu-Ray, HD-DVD, HD-VIVID, CH-DVD, HDTV, 1080i, 1080p, Flash, Quicktime, RealMedia, VHS, VHS-C, S-VHS, S-VHS-C, D-VHS, Windows Media, 8 mm, Video8, Hi8, Digital8, Beta, Betamax, Betacam, Betacam SP, Betacam SX, Digital Betacam, 3GP, and 3G2.

In addition, there may be multiple parameters within each format which may be varied including bit rate, frame rate, resolution, or other parameters. Throughout this description, adjustment of any one or more of these parameters is referred to as adjusting the 'encoder rate.' Adjusting the encoder rate may refer to the operation of a codec, video encoder, or other video formatting device. Since video encoding is a computationally intensive process, varying the encoder rate affects the processing requirements in the system, as well as affecting how much data must be transmitted to other devices in the system. In turn, these factors affect how much power is used by the system and how much heat is generated by the system.

Figure 6:
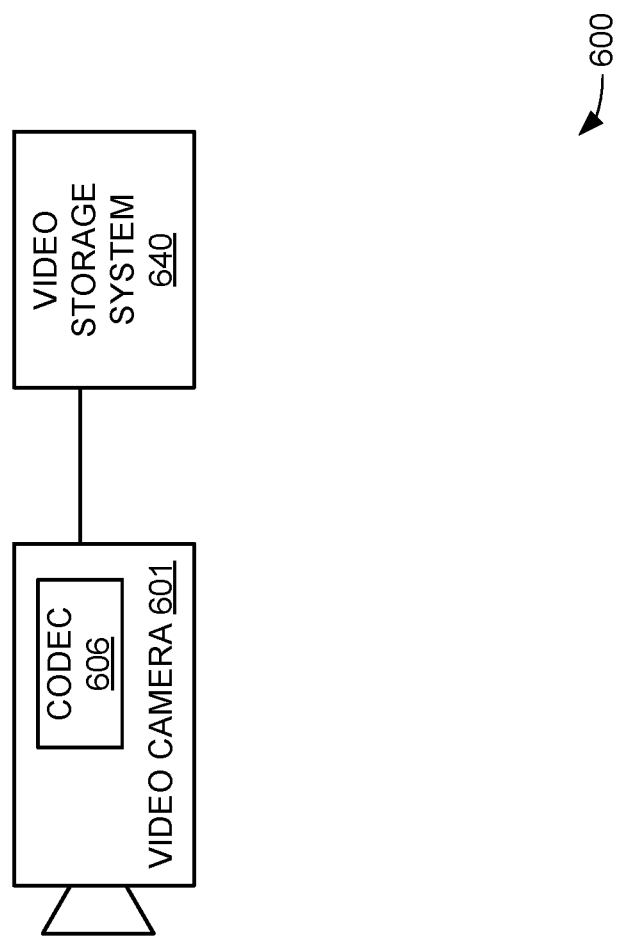
FIG. 6 illustrates a video system.

FIG. 6 illustrates video system 600. Video system 600 comprises video camera 601 and video storage system 640. Video camera 601 comprises codec 606. Video camera 601 captures video of a scene and codec 606 performs processing which encodes or formats the video in a format which is compatible with video storage system 640. In FIG. 6, it should be understood that video storage system 640 may be replaced or supplemented by many other types of devices which receive, process, relay, display, or store video. It should also be understood that the function performed by codec 606 may also be performed outside of video camera 601.

Figure 7:
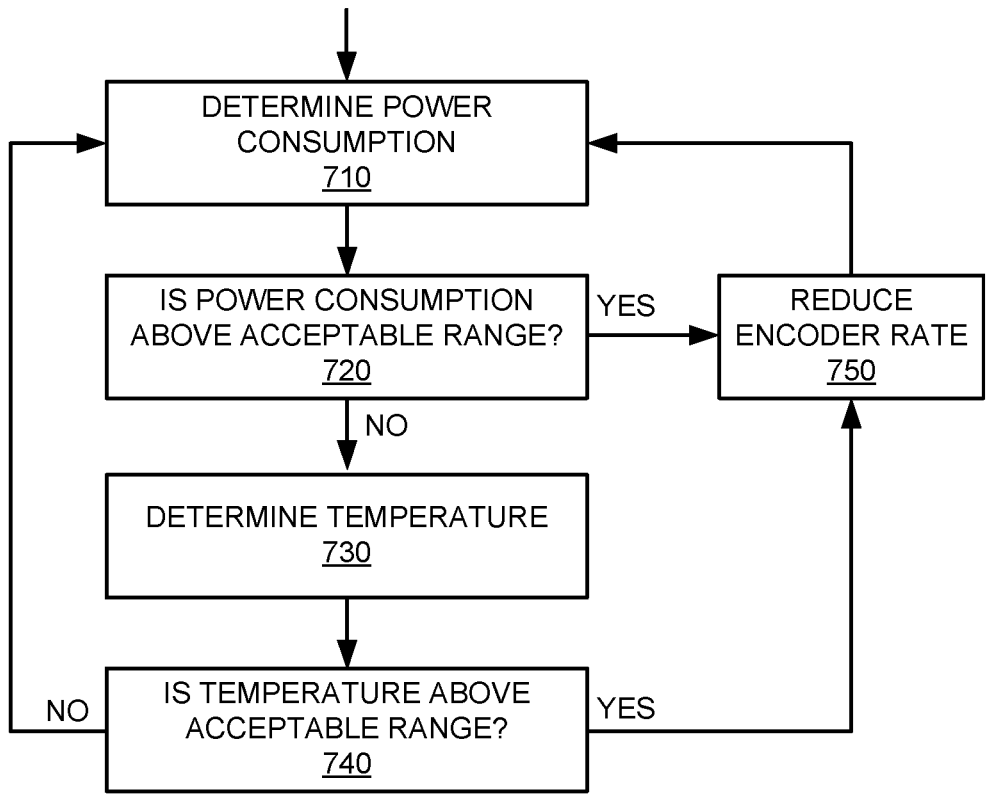
FIG. 7 illustrates an operation of a video system.

FIG. 7 illustrates an operation of video system 600. The steps of operation are indicated below parenthetically. Video system 600 determines how much power is being consumed (710) and then determines if the power consumption is outside of an acceptable range (720). The measured power consumption and range may pertain to the whole system, video camera 601, codec 606, or some other subset of video system 600. If the power consumption is above the acceptable range, the encoder rate of codec 606 is reduced (750). Reducing the encoder rate may include reducing the frame rate, bit rate, resolution, other video parameter, or combinations thereof.

If the power consumption does not exceed an acceptable range, the temperature is determined (730). The temperature may refer to the ambient temperature of the environment in which video camera 601 is operating, the temperature of video camera 601 itself, or the temperature of codec 606. If the temperature is above an acceptable range, the encoder rate of codec 606 is reduced (740). It should be understood that the power consumption and temperature may be determined in a different order, at different times, or at different frequencies.

Referring back to FIG. 6, video camera 601 comprises codec 606. Video camera 601 may also comprise other components or circuitry for capturing and transmitting images. For example, video camera 601 may be an analog camera, digital camera, internet protocol (IP) camera, or other type of camera. It should be understood that video camera 601 may have more than one codec. It should also be understood that the remainder of the functions described herein with respect to video camera 601 may be performed by other devices which transmit video even though they do not perform the initial optical capture of the video. For example, video camera 601 could also be replaced in FIG. 6 by a video switch, video buffer, video server, or other video transmission device, including combinations thereof, which perform a video processing function.

Codec 606 comprises software or circuitry for coding or decoding video signals. Codec 606 may be implemented entirely in software and executed on a processor of video camera 601, may be implemented in hardware, or may be implemented using some combination of hardware and software. Codec 606 may be capable of simultaneously producing video in multiple formats or may be switchable between multiple formats. Codec 606 may also perform analog-to-digital conversion, transformations, mathematical computations, modifications, formatting, conditioning, other processes, or combinations thereof.

Figure 8:
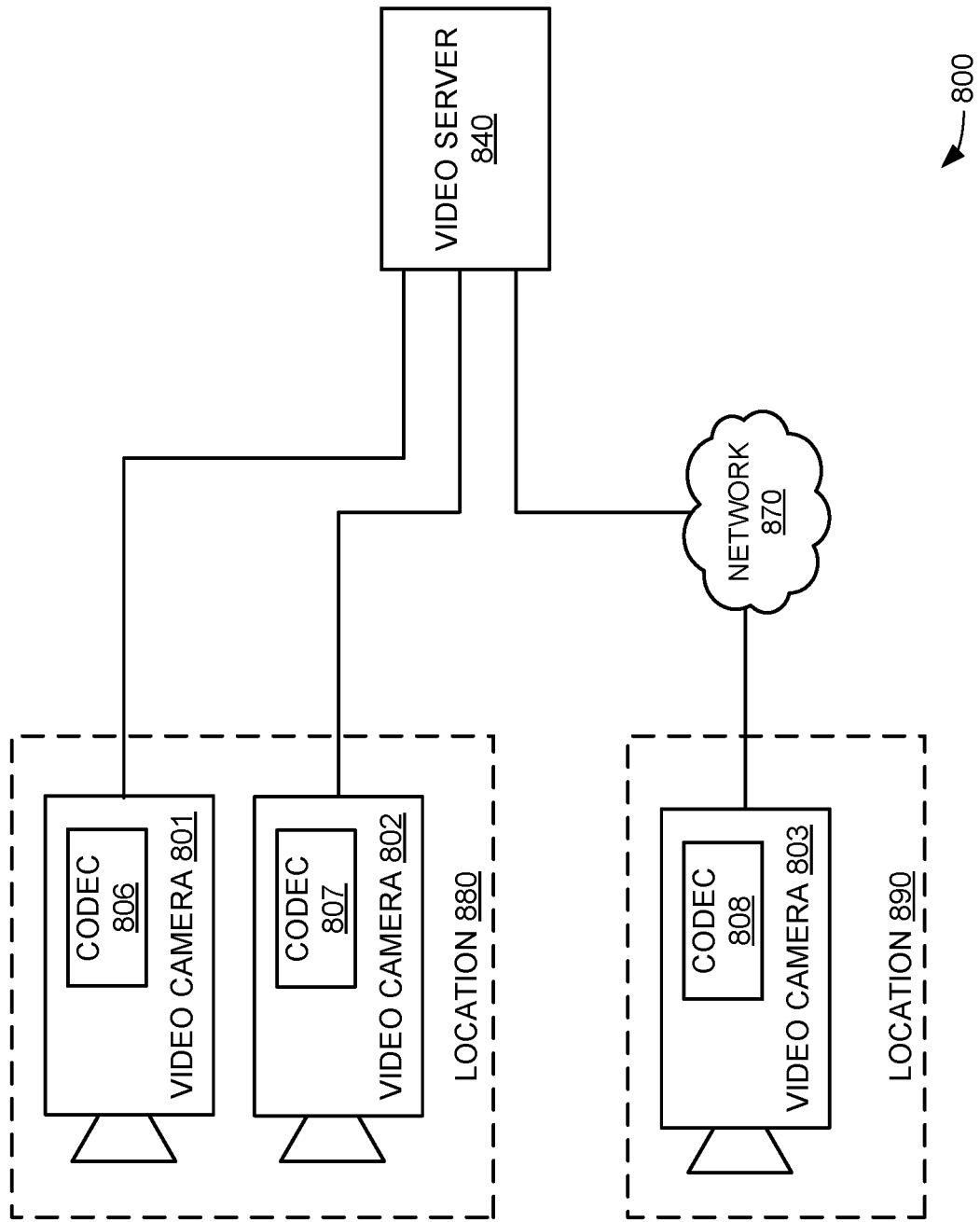
FIG. 8 illustrates a video system with cameras in two locations.

FIG. 8 illustrates video system 800 which provides video monitoring capabilities in two locations. Video system 800 comprises video cameras 801-803 at locations 880 and 890, network 870, and video server 840. Locations 880 and 890 may be different physical locations or may be different logical locations within a system which is at a single physical location.

Video server 840 receives video from video cameras 801-803. Video server 840 comprises a communication interface for receiving video. Video server 840 may also perform other functions including storing video, processing video, analyzing video, cataloging video, distributing video, controlling video cameras 801-803, controlling codecs 806-807, or other functions. Video server 840 may also comprise a user interface, memory, software, other communication components, a power supply, or structural support. Video server 840 may also be a digital video recorder (DVR), video analytics engine, or other device which receives formatted video.

Video server 840 communicates with video cameras 801 and 802 at location 880 through a direct link. Video server 840 communicates with video camera 803 at location 890 through network 870. Network 870 may be any type of communication channel which connects video server 840 to video camera 803. Network 870 comprises a communication medium. The communication medium may be metal, air, space, optical fiber such as glass or plastic, or some other material, including combinations thereof. Network 870 may be an Internet, intranet, dedicated link, wireless link, or some other type of communication link. Network 870 could use various communication protocols, such as TDM, IP, Ethernet, telephony, optical networking, wireless protocols, or some other type of communication signaling or communication format, including combinations thereof. Network 870 may provide a direct link between the devices or may provide an indirect link which includes routers, servers, or other types of network communication devices, including combinations thereof.

Video cameras 801-803 are examples of video camera 101 although video cameras 801-803 may have alternate configurations or operate in alternate manners. Video cameras 801-803 comprise codecs 806-808, respectively. Codecs 806-808 are examples of codec 606 although codecs 806-808 may have alternate configurations or operate in alternate manners.

Video server 840 receives video from video cameras 801-803 which has been processed and formatted by codecs 806-808. As described with respect to FIGS. 1 and 2, the encoder rate of codecs 806-808 are reduced if power consumption is above an acceptable range or if the temperature is above an acceptable range. Reducing the encoder rate reduces the amount of computational processing which is required thereby reducing the power consumption and heat generated. The determination process as to whether an encoder rate should be reduced may be made by video camera 801, codec 806, video server 840, or another device. After an encoder rate is reduced, the codec may return the original rate when directed to by video system 800, after a specified period of time, by command of a user, or through some other type of instruction.

In the case of location 880, the power consumption and temperature referenced above may be associated with video cameras 806 and 807 individually, may be associated with both cameras as a combined system, or may also include other equipment of video system 800 which is at location 880. The temperatures described above may also pertain to the general location in which the camera and codec are located.

The encoder rates of codecs 806 and 807 may be adjusted independently or may be adjusted in a synchronized fashion. Temperature data may be embedded in the video or reported separately. Responses to temperatures which are exceeding an acceptable threshold may be made in the form of adjustments to encoder rates of one device in the area or adjustments to the encoder rates of multiple devices in the area. Power consumptions may relate to overall system power budgets, individual device battery levels, cabling capacity, solar panel power availability, solar panel supply forecasts, or other power source characteristics or budgeting factors.

In addition to the operation described above, video system 800 may be configured to increase encoder rates to keep a codec or camera above a minimum operating temperature. In one example, location 890 is a cold location and video camera 803 has a minimum operating temperature. The rate of codec 808 may be increased, even though it may not otherwise be needed or requested for video quality purposes, to increase the temperature of codec 808 and/or video camera 803.

Video system 800 may also be configured to transmit notifications or alerts when encoder rates are changed as described above. These notifications or alerts may be sent to a user, a central server, or other devices in video system 800.

In another example of operation, video system 800 may be configured to automatically change the encoder rates according to a prescribed schedule. These prescribed schedules may relate to work schedules, store hours, weather forecasts, event times, or other activities. The scheduled changes in encoder rates may also be communicated to or coordinated with the schedules and settings of heating and cooling systems. This may be necessary to minimize under or over correction of the heating and cooling systems in response to changes in encoder rates.

In another example of operation, video system 800 may be configured to reduce encoder rates of codecs 806-808 when no motion is present in the scene of its associated camera. In this manner, processing resources, power, communication bandwidth, or other resources are preserved when there is little or no information of interest in the video. When motion is detected, the encoder rate associated with that camera is increased. If this rate increase causes temperature or power thresholds to be exceeded, other encoder rates in the system may be reduced to compensate the power or heat increases. In addition, other elements of the system may be put into lower power modes or shut down altogether. These actions may also be taken if power or temperature thresholds are not exceeded but forecasts or trends indicate that they may exceeded in the near future.

Figure 9:
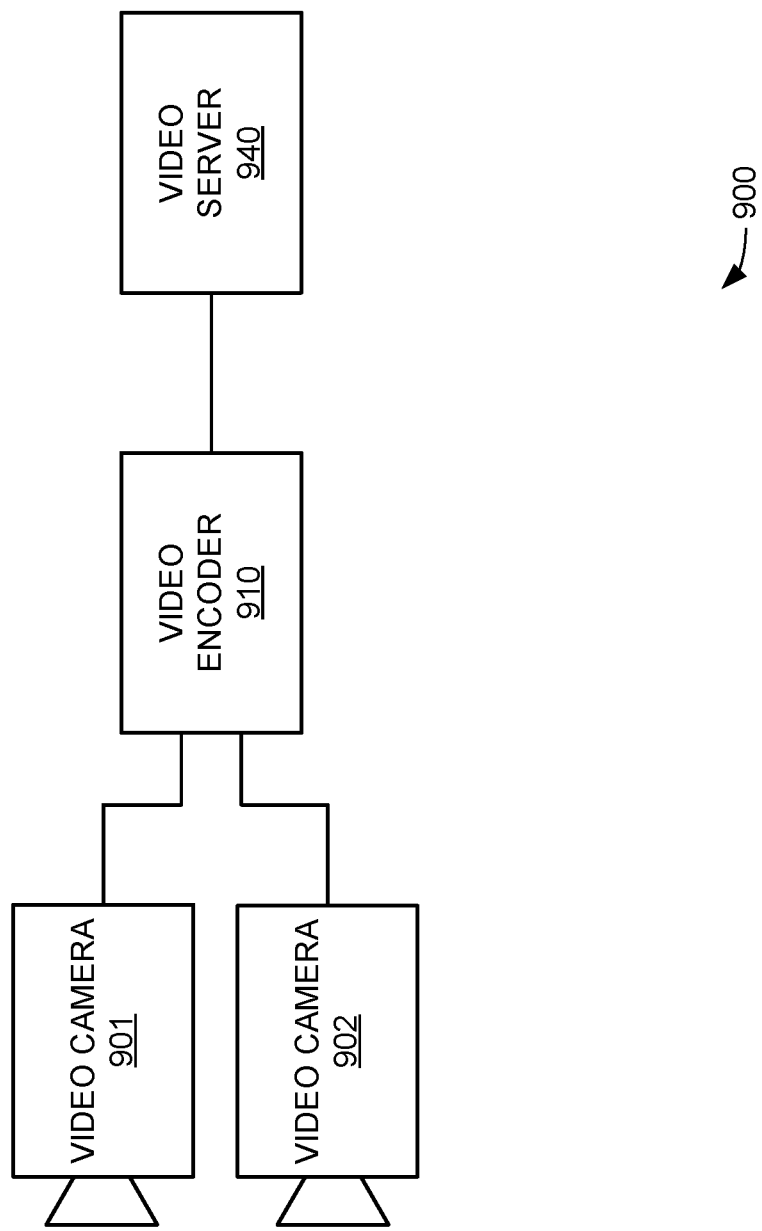
FIG. 9 illustrates a video system with a shared video encoder.

FIG. 9 illustrates video system 900 which uses shared video encoder 910. Video encoder 910 performs an operation similar to codecs 106 and codecs 306-308, but performs these functions for multiple video cameras. Video encoder 910 may be at the same physical location as video cameras 901-902 or may be at a different physical location. The encoder rate of video encoder 910 may be adjusted for all of the reasons and in all the manners discussed in the examples above. If video encoder 910 is in a different physical location than video cameras 901-902 and video server 940, the encoder rate may be adjusted in response to temperatures at video encoder 910 even though the temperatures at video cameras 901-902 and video server 940 are within an acceptable range.

Figure 10:
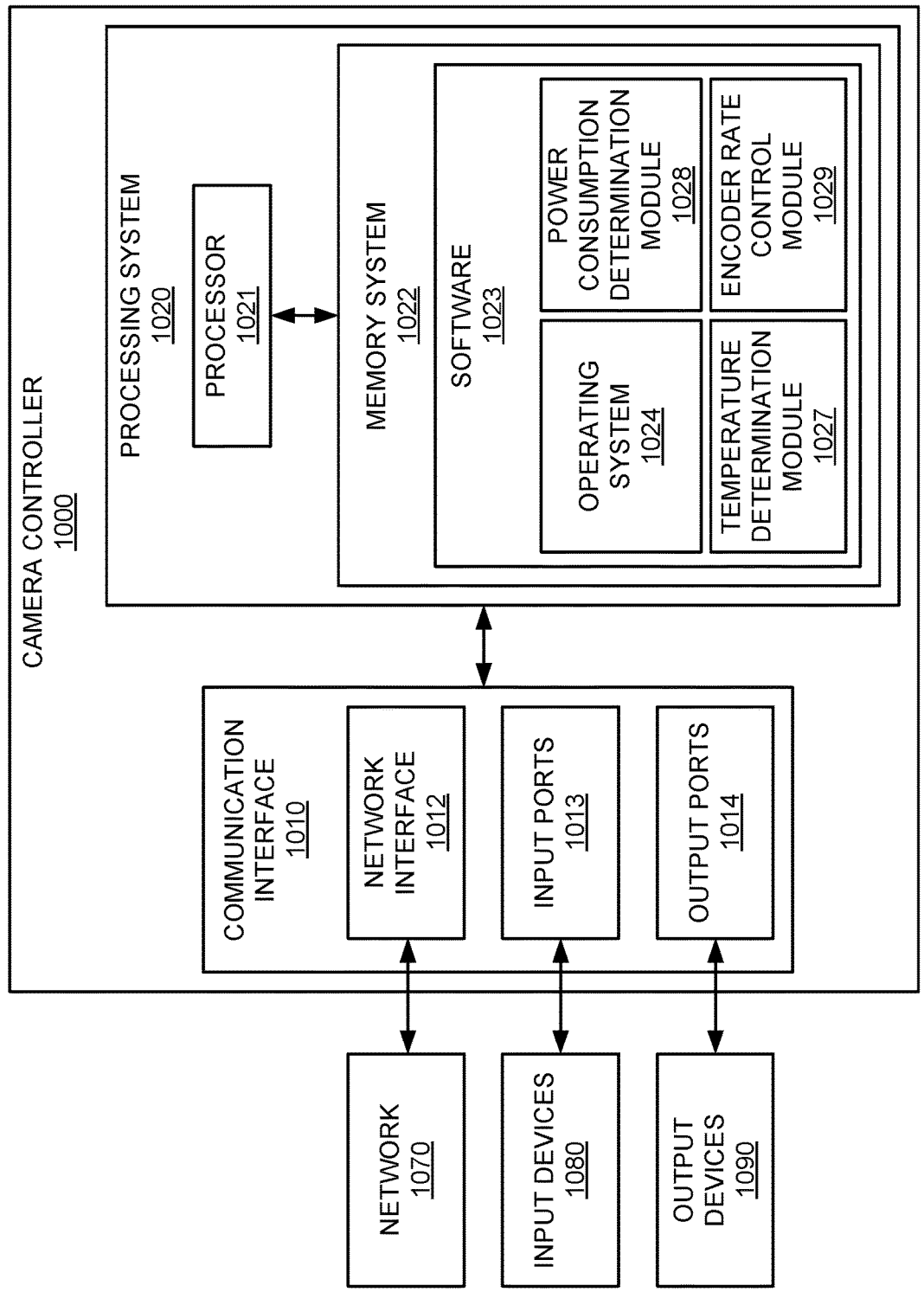
FIG. 10 illustrates a camera controller.

FIG. 10 illustrates camera controller 1000. Camera controller 1000 performs control functions for one or more video cameras like video cameras 601, 801-803, or 901-902. Camera controller 1000 may be located in a video camera or may be located elsewhere in a video system. Camera controller 1000 includes communication interface 1010 and processing system 1020. Processing system 1020 is linked to communication interface 1010 through a communication link. Processing system 1020 includes processor 1021 and memory system 1022.

Communication interface 1010 includes network interface 1012, input ports 1013, and output ports 1014. Communication interface 1010 includes components that communicate over communication links, such as network cards, ports, RF transceivers, processing circuitry and software, or some other communication device. Communication interface 1010 may be configured to communicate over metallic, wireless, or optical links. Communication interface 1010 may be configured to use TDM, IP, Ethernet, optical networking, wireless protocols, communication signaling, or some other communication format, including combinations thereof. Network 1070 is an example of network 370. A video camera is an example of both input devices 1080 and output devices 1090. Other examples of input devices 1080 are a user interface or a system controller. Other examples of output devices 1090 are a display or an alert system.

Processor 1021 includes microprocessor and other circuitry that retrieves and executes operating software from memory system 1022. Memory system 1022 comprises software 1023. Memory system 1022 may be implemented using random access memory, read only memory, a hard drive, a tape drive, flash memory, optical storage, or other memory apparatus.

Software 1023 comprises operating system 1024, power consumption determination module 1028, temperature determination module 1027, and encoder rate control module 1029. Software 1023 may also comprise additional computer programs, firmware, or some other form of non-transitory, machine-readable instructions. When executed by processor 1021, software 1023 directs processing system 1020 to operate camera controller 1000 to achieve the results described in the examples above. Specifically, power consumption is determined using power consumption determination module 1028 and temperature is determined using temperature determination module 1027. If either temperature or power consumption is above an acceptable range, one or more encoder rates are reduced using encoder rate control module 1029. These changes may be communicated using output ports 1014 or network interface 1012.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method of sharing encoded video comprising:
   determining a video profile for each of a plurality of receiving devices capable of receiving transmitted video streams, wherein each video profile includes a set of video formats which the receiving device associated with the video profile is capable of receiving and processing and a set of other parameters, wherein the set of other parameters further define the video receiving capabilities of the receiving device associated with the video profile;
   determining if two or more of the plurality of receiving devices are capable of receiving video in the same format based on each receiving devices' video profile;
   determining if the two or more of the plurality of receiving devices capable of receiving video in the same format are similar by determining if the set of other parameters associated with each receiving devices' video profile differ by less than a threshold value;
   transmitting a first video stream encoded by a codec in a first format to each of the two or more of the plurality of receiving devices if they are determined to have similar profiles; and
   transmitting simultaneously the first video stream and at least a second video stream encoded simultaneously by the codec in different formats to the receiving devices if they do not have similar profiles.

2. The method of claim 1, wherein a video output module determines the video profiles associated with each of the plurality of devices based on receiving profile information from each of the plurality of devices.

3. The method of claim 1, wherein a video output module determines the video profiles associated with each of the plurality of devices based on information contained in the video output module for each of the plurality of devices.

4. The method of claim 1, wherein a video encoder determines the video profiles associated with each of the plurality of devices based on receiving profile information from each of the plurality of devices.

5. The method of claim 1, wherein a video encoder determines the video profiles associated with each of the plurality of devices based on information contained in the video encoder for each of the plurality of devices.

6. The method of claim 1, further comprising specifying the set of other parameters within each video format.

7. The method of claim 4, wherein the set of other parameters are selected from the group consisting of at least one of: bit rate, frame rate, and image resolution.

8. The method of claim 4, wherein the set of other parameters vary within each video format.

9. The method of claim 1, wherein the video format is selected from the group consisting of: MPEG-1, MPEG-2, MPEG-4, MPEG-7, MPEG-21, H.264, DV, MiniDV, DVCAM, DVCPRO, DVCPR050, DVCPRO HD, HDV, DVD, Blu-Ray, HD-DVD, HD-VMD, CH-DVD, HDTV, 1080i, 1080p, Flash, Quicktime, RealMedia, VHS, VHS-C, S-VHS, S-VHS-C, D-VHS, Windows Media, 8 mm, Video8, Hi8, Digital8, Beta, Betamax, Betacam, Betacam SP, Betacam SX, Digital Betacam, 3GP, and 3G2.

10. The method of claim 1, wherein the threshold is set to a predetermined percentage of difference.

11. The method of claim 1, wherein the threshold is set to a predetermined absolute difference.

12. The method of claim 1, wherein the threshold is a comparison of different thresholds for multiple parameters.

13. A method of sharing encoded video comprising:
   determining a video profile for each of a plurality of receiving devices capable of receiving transmitted video streams, wherein each video profile includes a set of video formats which the receiving device associated with the video profile is capable of receiving and processing and a set of other parameters, wherein the set of other parameters further define the video receiving capabilities of the receiving device associated with the video profile;
   determining if two or more of the plurality of receiving devices are capable of receiving video in the same format based on each receiving devices' video profile;
   determining if the two or more of the plurality of receiving devices capable of receiving video in the same format are similar by determining if the set of other parameters associated with each receiving devices' video profile differ by less than a threshold value;
   transmitting a first video stream encoded by a codec in a first format to each of the two or more of the plurality of receiving devices if they are determined to have similar profiles;
   transmitting simultaneously the first video stream and at least a second video stream encoded simultaneously by the codec in different formats to the receiving devices if they do not have similar profiles
   monitoring power consumption and temperature during the transmitting; and
   modifying an encoding rate of the codec if the power consumption and/or temperature are above an accepted range.

14. The method of claim 13, wherein the monitored power consumption is that of the system as a whole.

15. The method of claim 13, wherein the monitored power consumption is that of the codec.

16. The method of claim 13, wherein the monitored temperature is that of the codec.

17. The method of claim 13, wherein the encoding rate comprises a frame rate, a bit rate, and an image resolution for each video stream.

18. The method of claim 17, wherein the modification of the encoding rate reduces the frame rate.

19. The method of claim 17, wherein the modification of the encoding rate reduces the resolution.

20. The method of claim 17, wherein the modification of the encoding rate reduces the resolution.

21. The method of claim 13, wherein the modification of the encoding rate is applied to all video streams.

22. The method of claim 13, wherein the modification of the encoding rate is applied to the first video streams.

23. The method of claim 13, further comprising after the encoding rate has been modified, modifying the encoding rate to the original encoding rate.

24. The method of claim 23, wherein the original encoding rate is resumed after a predetermined amount of time.

25. The method of claim 23, wherein the original encoding rate is resumed after a command by the user.

* * * * *